United States Patent
Albrecht et al.

(10) Patent No.: US 8,232,532 B2
(45) Date of Patent: Jul. 31, 2012

(54) OFF-AXIS ION MILLING DEVICE FOR MANUFACTURE OF MAGNETIC RECORDING MEDIA AND METHOD FOR USING THE SAME

(75) Inventors: Thomas Robert Albrecht, San Jose, CA (US); Jeffrey S. Lille, Sunnyvale, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 556 days.

(21) Appl. No.: 12/489,873

(22) Filed: Jun. 23, 2009

(65) Prior Publication Data

US 2010/0320393 A1    Dec. 23, 2010

(51) Int. Cl.
   *G21K 5/04*    (2006.01)
(52) U.S. Cl. .......... 250/396 R; 250/396 ML; 250/492.1; 250/492.2; 250/492.3
(58) Field of Classification Search .............. 250/396 R, 250/397, 492.1, 492.2, 492.22, 492.23, 492.3, 250/396 ML
See application file for complete search history.

(56) References Cited

U.S. PATENT DOCUMENTS

| | | | | |
|---|---|---|---|---|
| 4,710,639 | A | 12/1987 | Sawaragi | 250/492.2 |
| 4,936,968 | A | 6/1990 | Ohnishi et al. | 204/192.34 |
| 5,422,490 | A | 6/1995 | Nakamura et al. | 250/492.21 |
| 5,637,879 | A | 6/1997 | Schueler | 250/492.21 |
| 6,072,251 | A * | 6/2000 | Markle | 310/12.05 |
| 6,099,698 | A | 8/2000 | Hatakeyama et al. | 204/192.15 |
| 6,278,582 | B1 * | 8/2001 | Okawa et al. | 360/235.2 |
| 6,614,026 | B1 | 9/2003 | Adamec | 250/398 |
| 6,664,552 | B2 | 12/2003 | Shichi et al. | 250/492.21 |
| 7,585,399 | B1 * | 9/2009 | Lai et al. | 204/298.16 |
| 2002/0088950 | A1 * | 7/2002 | Hamamoto et al. | 250/492.21 |
| 2003/0173527 | A1 | 9/2003 | Adachi et al. | 250/492.21 |
| 2004/0163766 | A1 * | 8/2004 | Kanarov et al. | 156/345.49 |
| 2004/0227105 | A1 | 11/2004 | Benveniste et al. | 250/492.21 |
| 2005/0003675 | A1 * | 1/2005 | Carducci et al. | 438/710 |
| 2008/0078750 | A1 | 4/2008 | Boguslavsky et al. | 219/121.41 |
| 2008/0224491 | A1 * | 9/2008 | Gillespie et al. | 294/106 |
| 2008/0230724 | A1 * | 9/2008 | Low | 250/492.21 |
| 2009/0078571 | A1 * | 3/2009 | Abarra et al. | 204/298.16 |
| 2010/0252746 | A1 * | 10/2010 | Sinclair et al. | 250/396 R |

FOREIGN PATENT DOCUMENTS

| | | |
|---|---|---|
| JP | 62172649 | 7/1987 |
| JP | 7191169 | 7/1995 |
| JP | 8241689 | 9/1996 |
| JP | 10255707 | 9/1998 |

\* cited by examiner

*Primary Examiner* — David A Vanore
*Assistant Examiner* — Nicole Ippolito
(74) *Attorney, Agent, or Firm* — Zilka-Kotab, PC

(57) ABSTRACT

A tool for patterning a disk such as a magnetic media disk for use in a disk drive system. The tool includes a chamber and a first and second series of magnets, each evenly spaced about the chamber wall. An ion beam source at an end of the chamber emits an ion beam toward the disk which is held within the chamber. The first series of magnets deflect the ion beam away from center and toward the chamber wall. The second ion beam source deflects the ion beam back toward the center so that the ion beam can strike the disk at an angle. In addition, to bending the ion beam, the magnets also rotate the bent ion beam so the movement of the ion beam revolves within the chamber.

22 Claims, 14 Drawing Sheets

OFF-AXIS ION MILLING DEVICE FOR MANUFACTURE OF MAGNETIC RECORDING MEDIA AND METHOD FOR USING THE SAME

FIELD OF THE INVENTION

The present invention relates to magnetic data recording, and more particularly to a tool and method for manufacturing patterned magnetic recording media.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider toward the surface of the disk, and when the disk rotates, air adjacent to the disk moves along with the surface of the disk. The slider flies over the surface of the disk on a cushion of this moving air. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In order to increase the data density of such magnetic data recording systems, the track-width of the system can be reduced while the linear density of the system can be increased. However, the data density of current and future recording systems is fast approaching the point that is has become very difficult to maintain good data resolution. One of the problems experienced at such high data densities is erasure of data due to thermal energy. When the track-width of the system is very small, media should have smaller grains with higher coercivity to minimize the superparamagnetic effect. However, there is a limit to scaling media grain size and coercivity. One way to minimize the superparamagnetic erasure of magnetic hits is to define a large, thermally stable bit on the magnetic medium Patterned magnetic recording media have been proposed to increase the data density in magnetic recording, data storage, such as hard disk drives. In bit patterned media (BPM), the magnetic material is patterned into small isolated blocks or islands such that there is a single magnetic domain in each island or "bit". The single magnetic domains can be a single grain or can consist of a few strongly coupled grains that switch magnetic states in concert as a single magnetic volume. This is in contrast to conventional continuous media wherein a single "bit" may have multiple magnetic domains separated by domain walls. U.S. Pat. No. 5,820,769 is representative of various types of patterned media and their methods of fabrication. A description of magnetic recording systems with patterned media and their associated challenges is presented by R. L. White et al., "Patterned Media: A Viable Route to 50 Gbit/in$^2$ and Up for Magnetic Recording?", IEEE Transactions on Magnetics, Vol. 33, No 1. January 1997, 990-995.

Similarly, discrete track media (DTM) consists of patterned isolated tracks where the magnetic storage layer of the media is removed between tracks. DTM creates a hybrid situation relative to BPM, where media in the downtrack direction is similar to conventional continuous media, but has patterned tracks in the cross-track direction.

Patterned media with perpendicular magnetic anisotropy have the desirable property that the magnetic moments are oriented either into or out of plane, which represent the two possible magnetization states, it has been reported that these states are thermally stable and that the media show improved signal-to-noise ratio (SNR) compared to continuous (un-patterned) media.

SUMMARY OF THE INVENTION

The present invention provides a tool for patterning a disk such as a magnetic media disk for use in a disk drive system, and can be used to treat other types of substrates as well. The tool includes a chamber and a first and second series of magnets, each appropriately spaced about the chamber wall. An ion beam source at an end of the chamber emits an ion beam toward the disk which is held within the chamber. The first series of magnets deflects the ion beam away from center and toward the chamber wall. The second series of magnets deflects the ion beam back toward the center so that the ion beam can strike the disk at an angle. In addition, to bending the ion beam, the magnets also rotate the bent ion beam so the bent ion beam rotates or revolves within the chamber. Furthermore, the path of the ions from the ion source to the media would gyrate about the axis of the chamber via a time varying magnetic field.

Another magnet can be placed beneath the disk to focus or defocus the ion beam to alter the area of the disk to be patterned by the ion beam. In another possible embodiment of the invention a third and fourth series of magnets can be provided and another ion beam source can also be provided at an end of the chamber opposite the first ion beam source. With such an embodiment, two sides of the disk can be patterned simultaneously, thereby increasing throughput time and saving manufacturing cost.

The second series of magnets (that series which is furthest from the ion source) preferably produces a stronger magnetic field than the first series of magnets (that which is closest to the ion beam source). In this way the ion beam is deflected back toward the center of the chamber, rattier than being deflected to a point that is just parallel with the axis of the chamber. This allows the ion beam to strike the surface of the disk at a desired angle. Varying the strength of the magnetic field produced by the first and second series of magnets can vary the angle at which the ion beam strikes the disk surface These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE EMBODIMENTS

The following description is of the best embodiments presently contemplated for carrying out this invention. This description is made for the purpose of illustrating the general principles of this invention and is not meant to limit the inventive concepts claimed herein.

Figure 1:
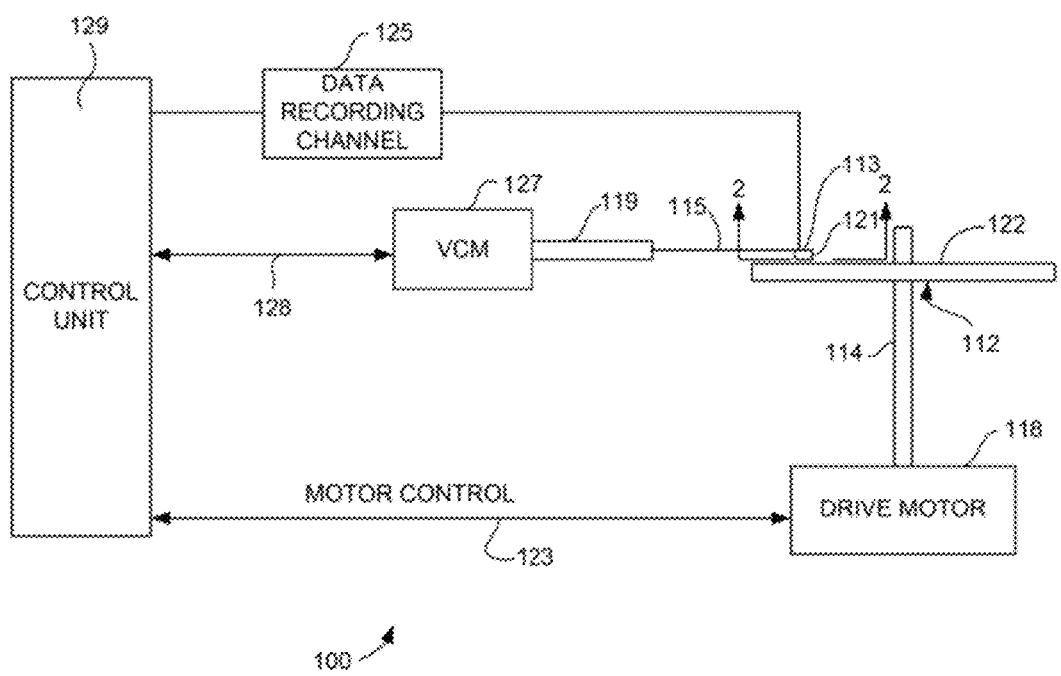
FIG. 1 is a schematic illustration of a magnetic data recording system that might incorporate a magnetic disk manufactured using a tool embodying the present invention.

Referring now to FIG. 1, there is shown an example of a disk drive 100. The disk drive may include a disk 112 that has been manufactured using a tool that can be an embodiment of the present invention, as will be described below. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances die slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control Signals on line 128. The control signals on line 128 provide the desired current profiles to optimally move and position slider 113 to the desired data track on disk 112. Write and read signals are communicated to and from write and read heads 121 by way of recording channel 125.

Figure 2:
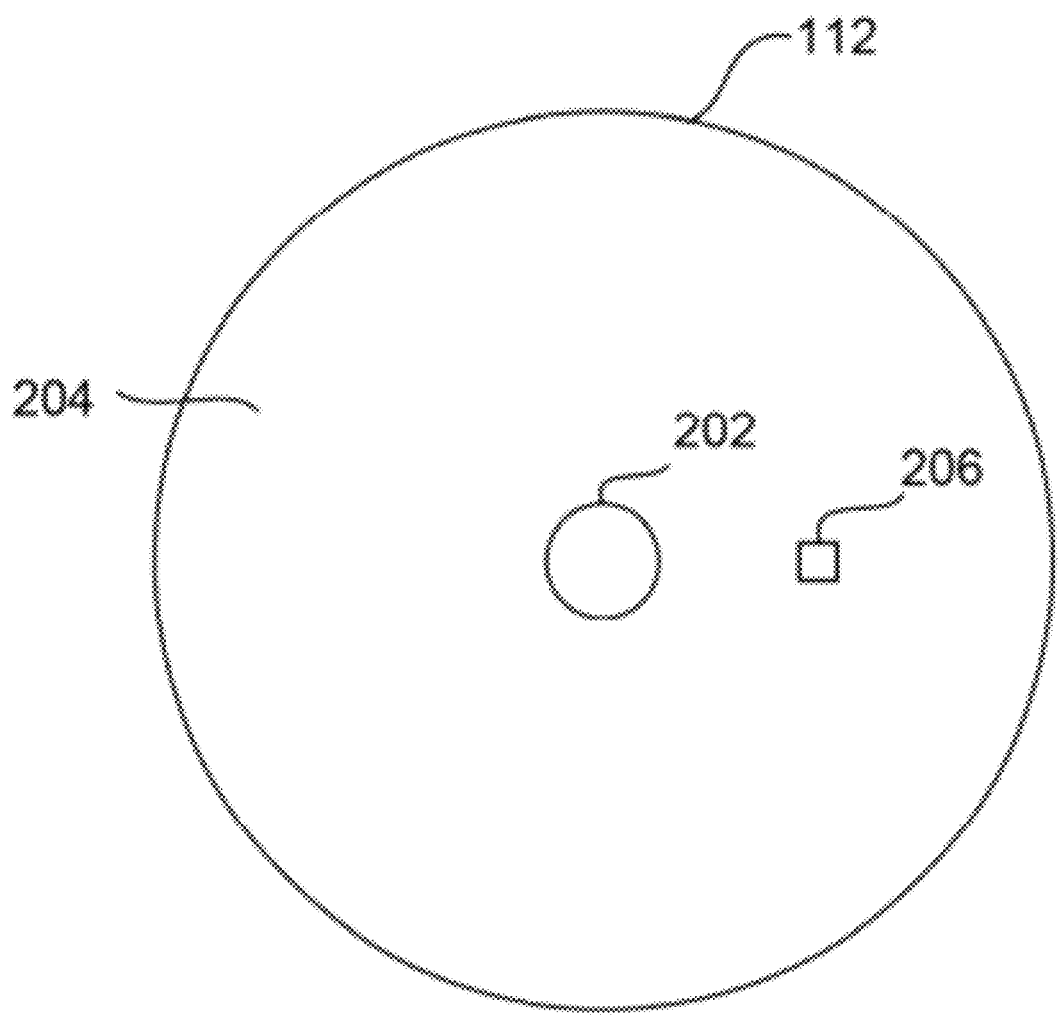
FIG. 2 is a top down view of a magnetic recording media.

FIG. 2 shows the magnetic disk (magnetic media) 112. As can be seen, the media 112 has a centrally located hole 202, for mounting the disk on a spindle 114 in a disk drive system 100. The disk has a surface 204 on which magnetic data signals can be written in concentric data tracks. The box area 206 shows a small area of the disk surface which is shown enlarged in FIG. 3.

Figure 3A:
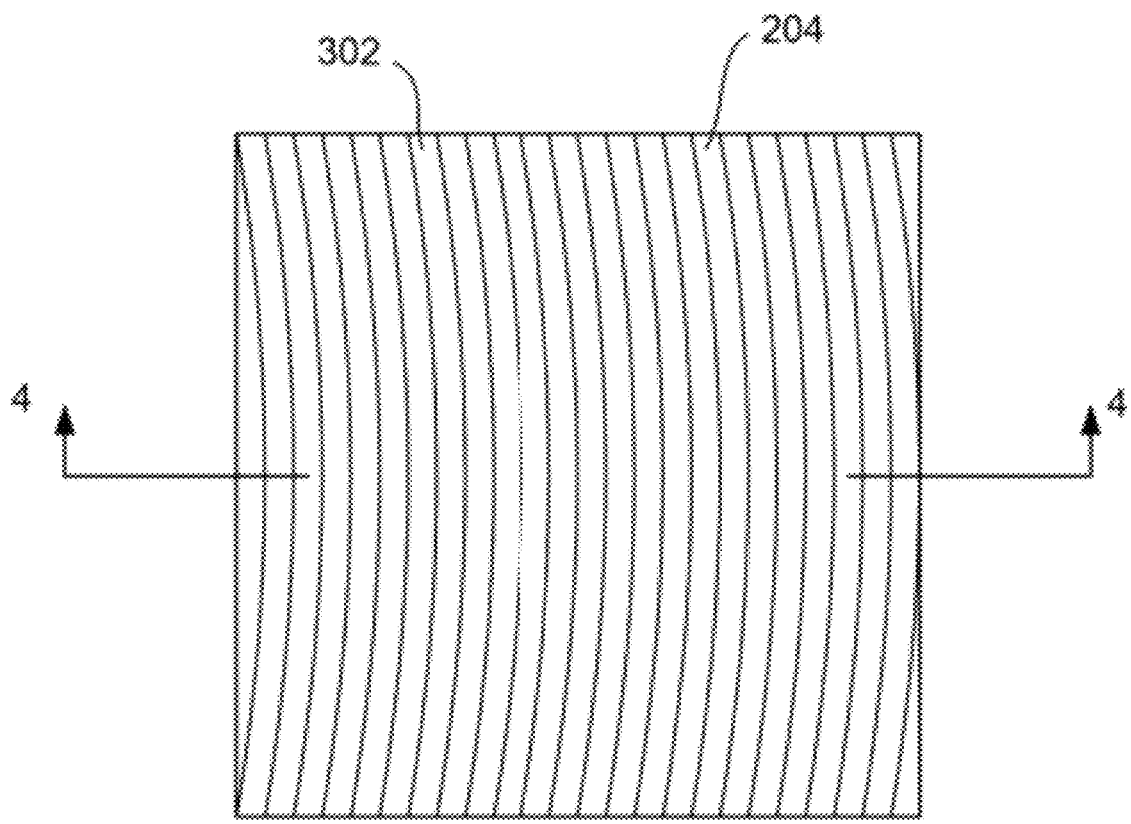
FIG. 3A is an enlarged view of a portion of the surface of the magnetic recording media of FIG. 2.
Figure 3B:
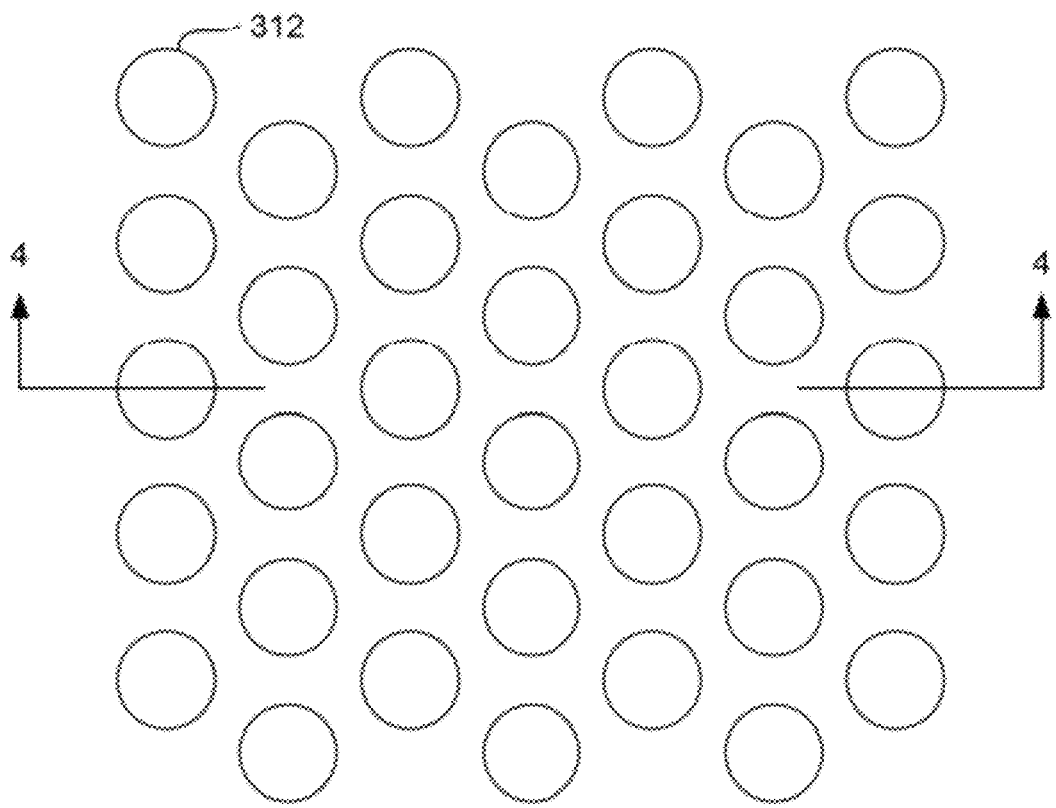
FIG. 3B is an enlarged view of a portion of the surface of a magnetic medium having a hit patterned media (BPM)

Therefore, FIG. 3A shows an enlarged view of a small portion of the surface of the disk. The surface of the disk 204 is formed with concentric ridges 302 that are formed to correspond with a data tracks formed thereon. The patterned media surface 204 may also be formed with patterned bits 312 as shown in FIG. 3B. The shape and packing of magnetic bits in FIG. 3B is only one example of BPM media 312. More generally, this patterned surface 204 can be seen more clearly with reference to FIG. 4, which shows a cross sectional view as taken from line 4-4 of FIG. 3A or FIG. 3B. The pitch of the patterned media tracks and/or bits may vary depending on head and media considerations.

Figure 4:
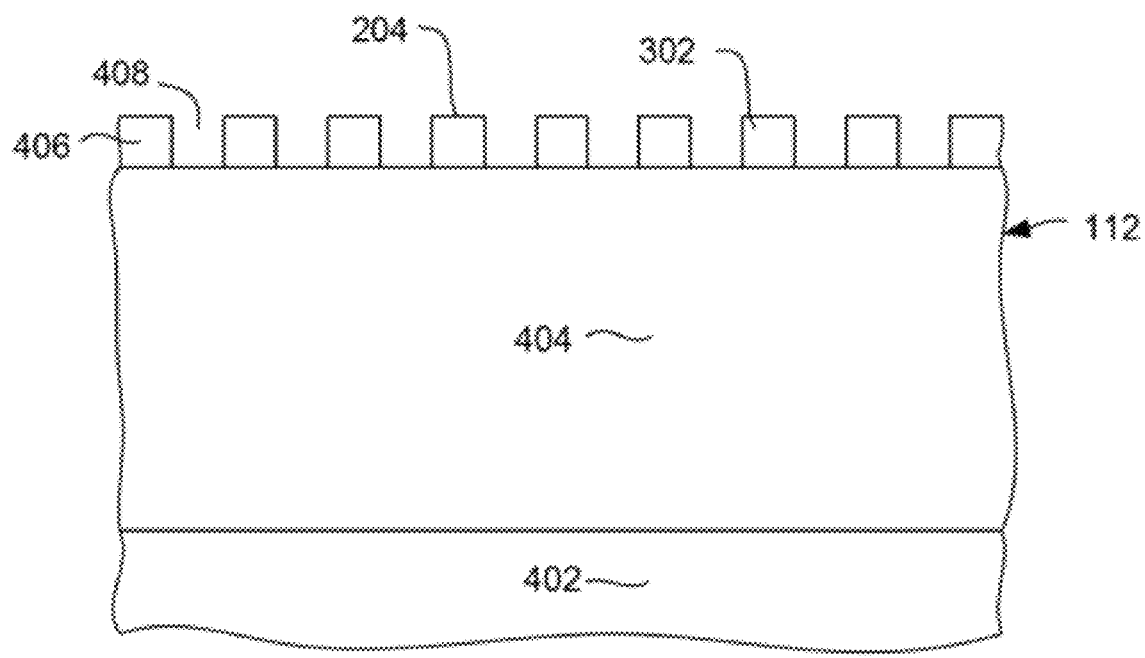
FIG. 4 is a cross sectional view of a portion of the magnetic media of FIGS. 2 and 3 as viewed from line 4-4 of FIG. 3.

As seen in FIG. 4, the disk 112 can include a substrate 402, constructed of a material such as aluminum-magnesium alloy or glass. A magnetically soft under-layer 404 is formed over the substrate 402, and a magnetically hard top layer is formed over the under-layer 404. The magnetically hard top layer 406 is patterned to form the concentric ridges 302. The troughs 408 between the ridges can extend down into the magnetically soft under-layer 404 or can stop short of the magnetically soft under-layer 404, but are shown in FIG. 4 as extending to the upper surface of the under-layer as a possible preferred embodiment of the invention. Alternatively, one could also pattern the hard layer 406 for patterned bits 312. It should be pointed out that the media disk 204 can include other layers as well that are not shown for purposes of clarity. Such additional layers may include, but are not limited to, an exchange break layer and an overcoat layer.

Figure 5:
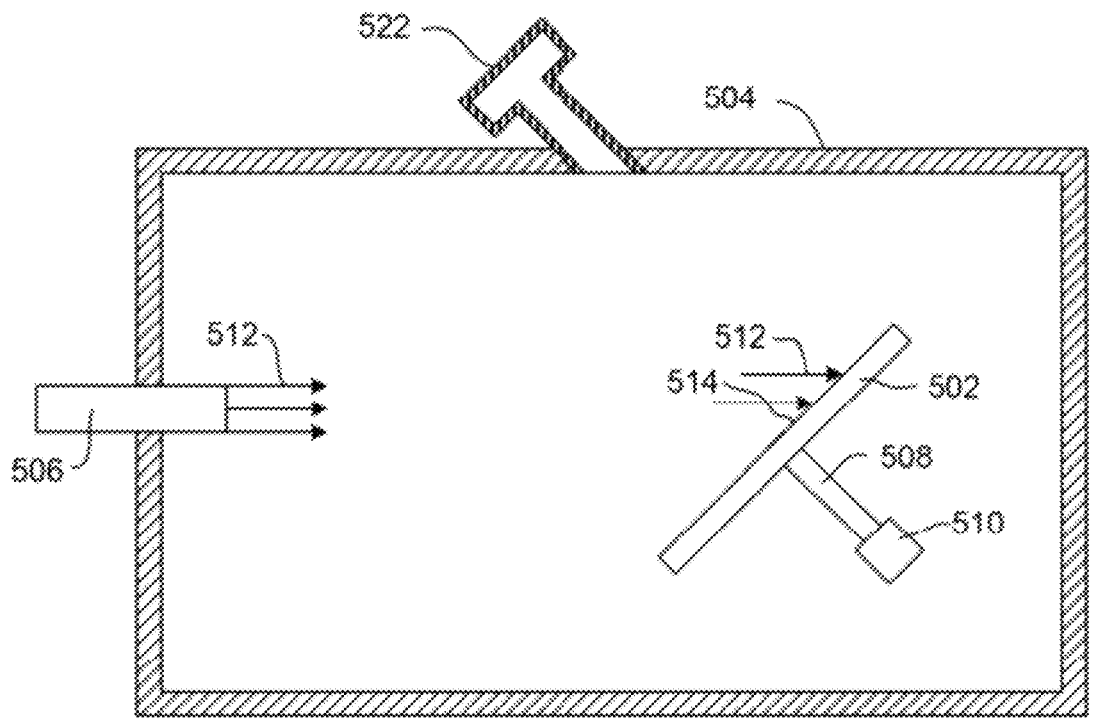
FIG. 5 is a schematic, cross sectional view of a tool for patterning a magnetic media, according to the prior art.

A patterned media can be formed by an ion milling process. However, forming such a patterned magnetic media in a traditional ion milling tool presents serious challenges. For example, as shown in FIG. 5, in order to pattern a magnetic media 502, the magnetic media (ie. disk 502) can be held within a tool 504 that includes an ion beam source 506. The media is held on a clamp 508 that is rotated by a motor or actuator 510. In order to form the necessary pattern, the ion milling must be performed at an angle relative to normal. This means that the disk 502 and clamp 508 must be held at an angle relative to the ion source 506. This is shown in FIG. 5. An ion beam 512 emits from the ion source 506 toward the disk 502, where the ion beam 506 strikes the disk 502 at a desired angle. Control of etching of the disk 502 may be improved with feedback from a metrology device (not shown) that could be incorporated with a chamber port 522 that would preferably have a line-of-sight to said disk 502.

The use of such a tool requires the use of complex mechanisms for tilting and rotating the disk 502 (e.g. motor 510, clamp 508, and other mechanisms, not shown). In addition, many manufacturing processes such as etching for patterning of a disk are performed in a multi-station machine. Therefore, there is a need for a tool that can greatly simplify a process for angled ion milling of a disk surface, in order to reduce manufacturing complexity, time and cost in said multi-station machine. Preferably, the disk holder or carrier would be common to other stations in the multi-station machine.

Figure 6:
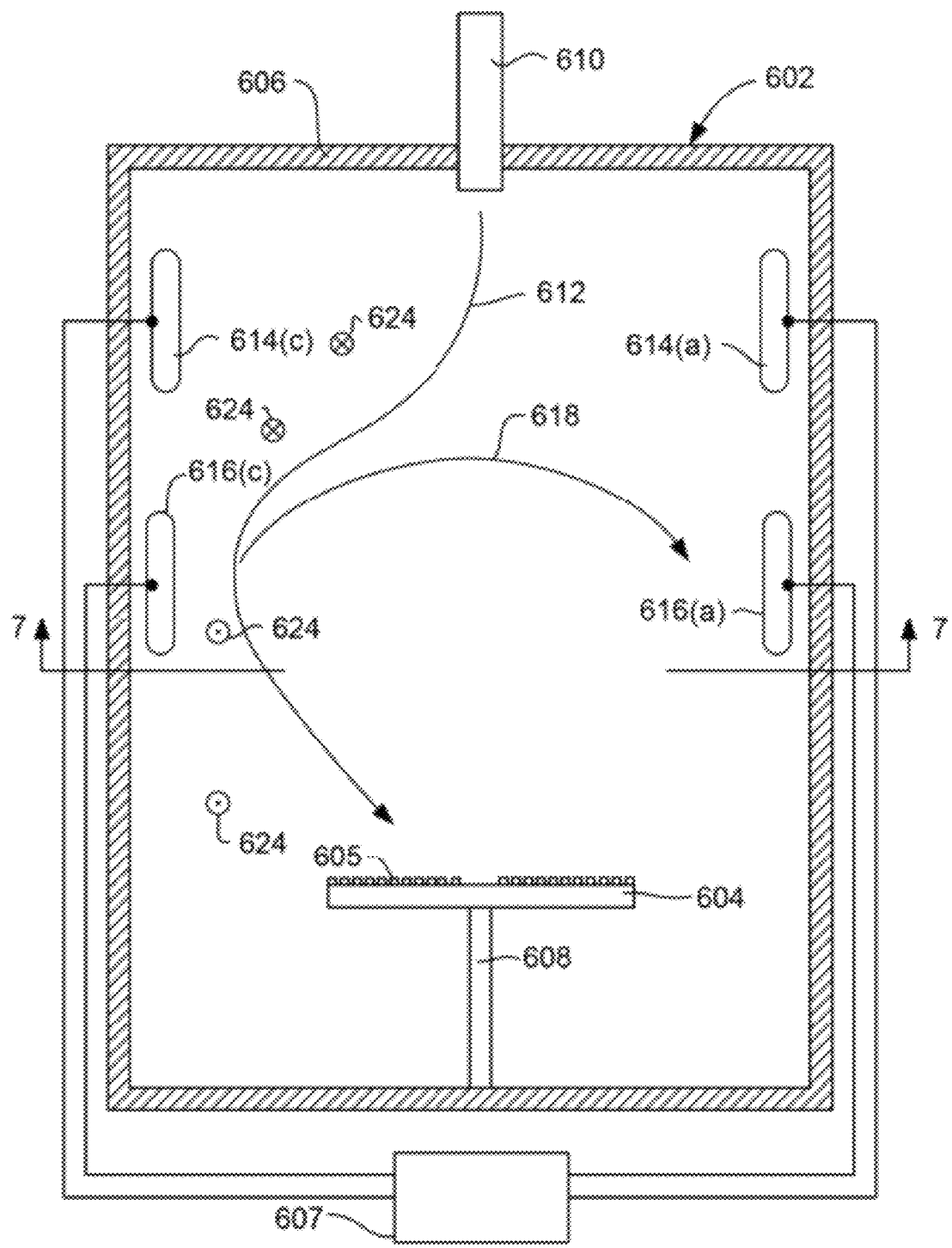
FIG. 6 is a schematic, cross sectional view of a tool for patterning a magnetic media according to the present invention.

The present invention provides a tool that, can pattern a magnetic media with an angled ion milling without the need for complex mounting, rotation and tilting mechanisms, using a greatly simplified structure. FIG. 6 shows a tool 602 for patterning magnetic media or disk 604. The tool 602 includes a chamber 606. The disk 604 can be held on a clamp 608, for mounting within the chamber 606, and is patterned with a mask 605 that is formed with concentric rings and spaces in between, the rings and spaces coinciding with the width and spacing of data tracks on the disk. The mask 605 shown in FIG. 6, is, of course not to scale, as the rings and space (shown in cross section in FIG. 6) could be much smaller and much more numerous, hi addition, the shape of mask 605 could also comprise bit patterned media (BMP).

It can be seen that the disk 604 does not have to be rotated, nor does it have to be tilted. Therefore, the disk 604 can be mounted on another structure such as by clamping to the outer periphery of the disk 604 or by holding the disk 604 on a platter or chuck (not shown). However, the disk 604 could rotate if needed.

Figure 7:
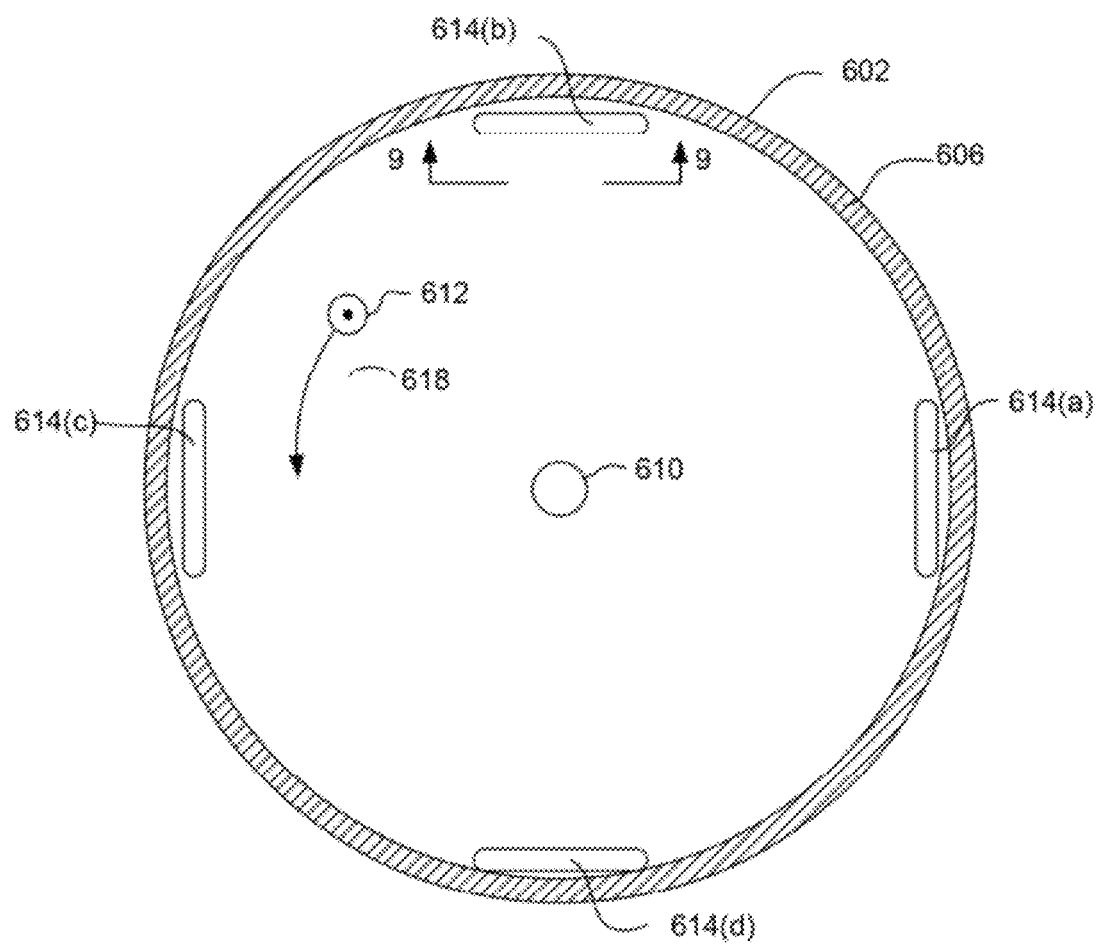
FIG. 7 is a cross sectional view taken from line 7-7 of FIG. 6.

The tool 602 includes an ion source 610 that can emit an ion beam 612. A first series of electro-magnets 614 surround a first portion of the chamber 606, and a second series of electro-magnets 616 surrounds a second portion of the chamber 606. The arrangement of the magnets 614 can be seen more clearly with reference to FIG. 7, which shows a cross section of the tool 602 as viewed from line 7-7 of FIG. 6. As can be seen then, the series of magnets 614 include magnets 614(*a*), 614(*b*), 614(*c*) and 614(*d*). The magnets 614, 616 (FIG. 6) can be located within or outside of the chamber 606, and the arrangement of four such magnets 614 shown in FIG. 7 is by way of example. Other arrangements are also possible, such as three magnets, five magnets, etc. evenly spaced about the chamber 606.

The magnets 614, 616 are controlled by circuitry that controls and varies the electrical current to and magnetic field produced by the magnets 614, 616. The magnets are electro-magnets that are energized such that at least two of the magnets (e.g. 614(*c*) and 614(*b*)) in FIG. 7 deflect the ion beam 612 by producing a magnetic field perpendicular relative to the path of the ion beam 612. With reference again to FIG. 6, the other set of magnets 616 has the opposite polarity. Adjacent magnets (eg. 614, 616) are activated to produce a magnetic field that is either into or out of the plane of FIG. 6. Some field lines 624 produced with magnets including 614(*c*) and magnetic field lines 626 produced with magnets including 616(*c*) are shown in FIG. 6. Therefore, while the first set of magnets 614 deflects the ion beam outward toward the wall of the chamber 606, the other set of magnets 616 deflects the ion beam 612 back inward toward the center of the chamber 606. The second series of magnets 616 preferably produces a stronger magnetic field than the first series of electromagnets 614 to deflect the ion beam 616 not just parallel with the axis of the tool 602, but back inward as shown. This causes the ion beam to bend as shown in FIG. 6. As can be seen, this causes the ion beam 612 to strike the disk 604 at an angle without the need to tilt the disk 604.

An approximation of the chamber dimensions and conditions can be made using the following equation v/r=qB/m,
where v is the velocity of the ions exiting the ion source, q is the charge on the ion, m is the mass of the ion, B is the magnetic field, and r is the radius of curvature. Substituting an Ar ion mass of $6 \times 10^{-26}$ kg with a velocity of 50,000 m/s (corresponding to an ion energy of about 500 eV), a magnetic field of 0.1 T yields a radius of curvature of the ion of 20 cm. With these conditions, it is preferable that the diameter of the chamber be greater than 40 cm. In general, it will be much larger to accommodate the volume of the magnets.

With reference to both FIGS. 6 and 7, the activation of the individual magnets (i.e. 614(*a*), 614(*b*), 614(*c*), 614(*d*) is varied so that the curved path of the beam 612 to the disk 604 rotates about the central axis of the fool, resulting in a rotating angle of approach of the beam 612 to the disk 604 as indicated by arrow 618. Similarly, magnets (616*a-d*) would be varied to complete the curved, path of the ion beam to the disk 604. As can be seen, this causes the ion beam to rotate around the disk in order to pattern the surface of the disk 604 without the need to rotate the disk 604 and without the need to tilt the disk 604. As discussed above, this form of ion milling allows the disk 604 to be patterned without the need for any complex mounting, rotating or tilting mechanisms. Optionally, the strength of the magnetic field from the magnets 614, 616 can be varied in order to deflect the ion beam as it strikes the disk 604.

Figure 8:
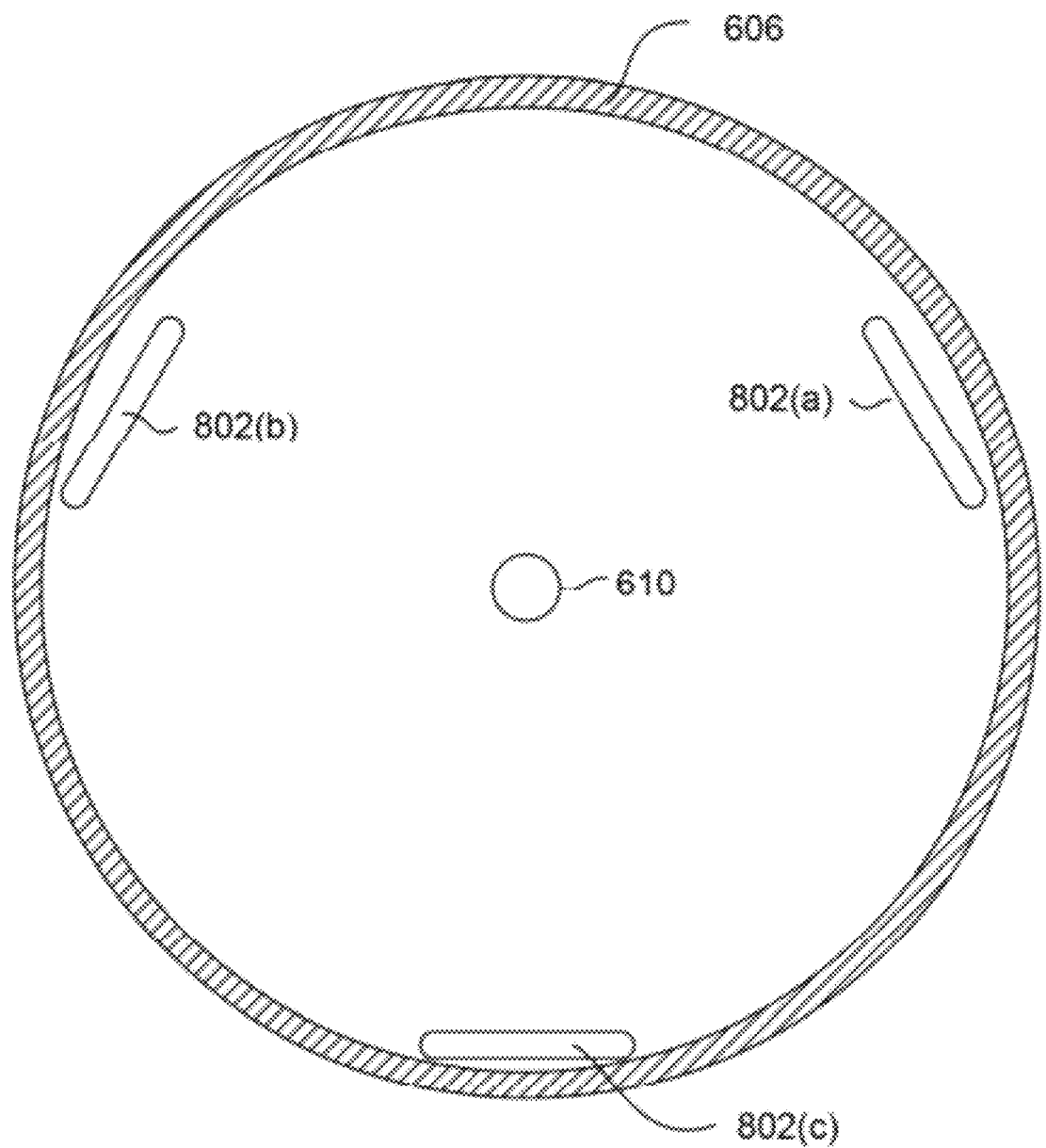
FIG. 8 is a cross sectional view similar to FIG. 7 of an alternate embodiment of the invention.

As mentioned above, the configuration described with reference to FIGS. 6 and 7 (with four magnets in each set 614, 616) is by way of example only. For example, as shown in FIG. 8, each set of magnets could include three magnets 802(*a*), 802(*b*) and 802(*c*) arranged symmetrically about the chamber.

Figure 9:
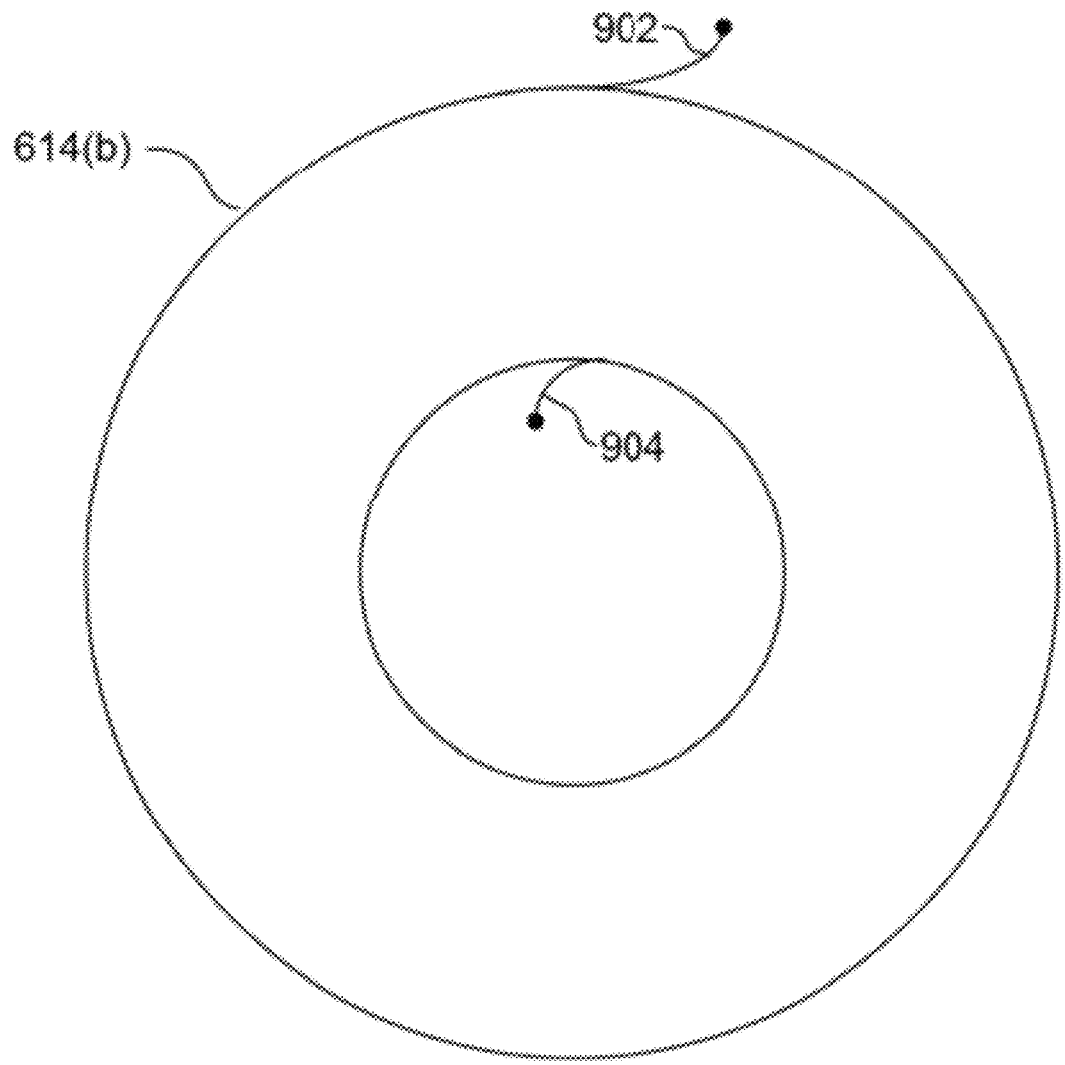
FIG. 9 is a view taken from line 9-9 of FIG. 7 showing a magnet for deflecting an ion beam.

FIG. 9 is a view of one of the magnets as viewed from line 9-9 of FIG. 7. As can be seen, the magnet can be formed as a coil wound into a doughnut shape, having an outer lead 902 and an inner lead 904 for supplying a current to the coil. This is by way of example, however, as other magnet configurations are possible as well.

Figure 10:
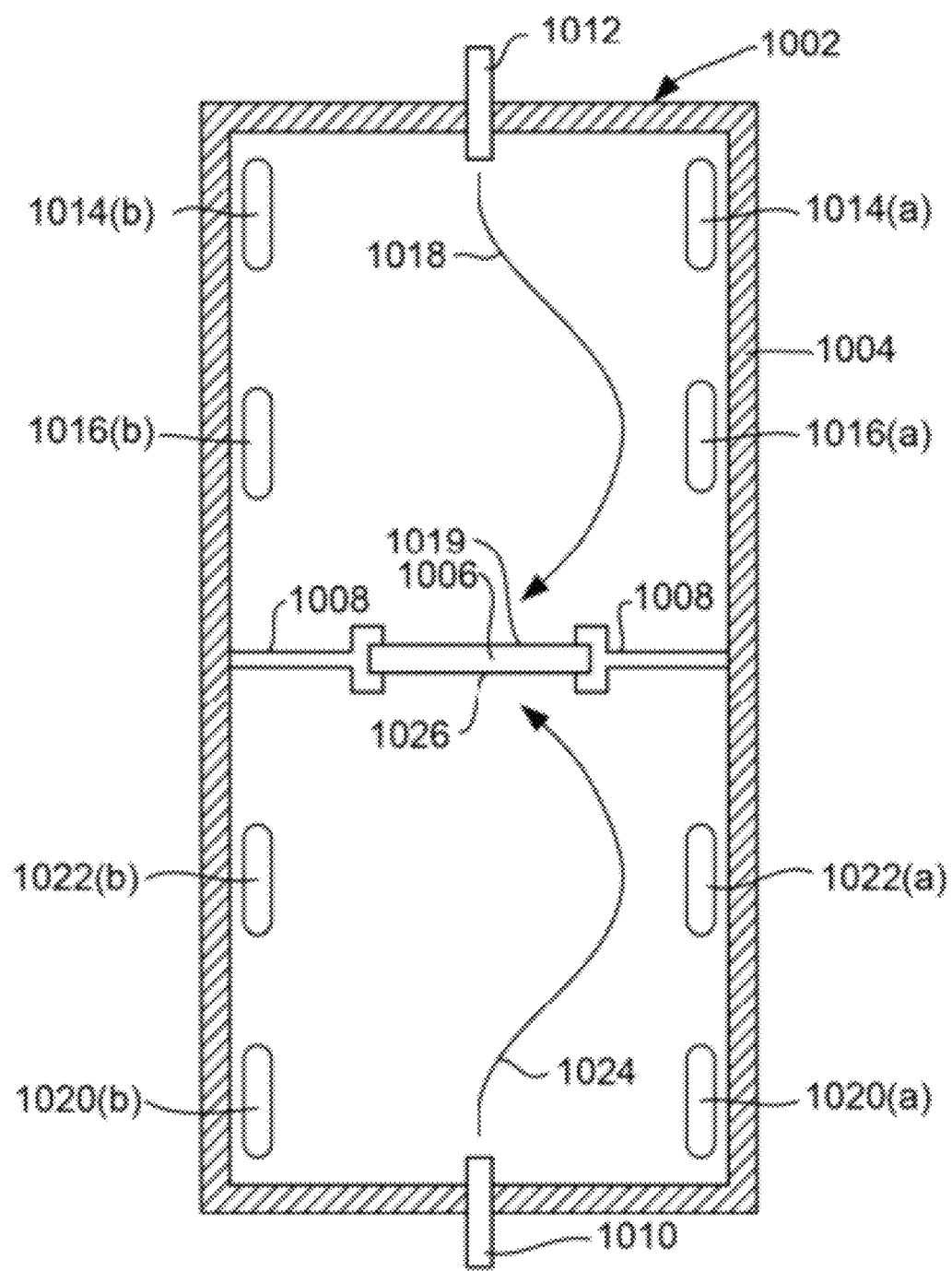
FIG. 10 is a schematic, cross sectional view of a tool for patterning magnetic media according to an alternate embodiment of the invention.

With reference to FIG. 10, another embodiment of the invention can be constructed to pattern both sides of a magnetic disk; simultaneously, thereby saving valuable time and cost. This patterning of both sides of the disk is made possible by the unique ion milling process of the present invention. This embodiment can include a tool 1002 including a chamber 1004. A disk 1006 is held within the chamber and may be held by a clamp the contacts the outer edges of the disk 1006, although other mechanisms could be configured for holding the disk 1006.

The tool 1002 further includes first and second ion beam sources 1010, 1012 located at opposite ends of die chamber 1004. On a first half of the chamber 1004, first and second sets of magnets 1014, 1016 are provided for bending and rotating a first ion beam 1018 as discussed above to pattern a first side 1019 of the disk 1006. In addition, third and fourth sets of magnets 1020, 1022 are provided at a second half of the chamber 1004. These third and fourth sets of magnets bend and rotate a second ion beam 1024 in the manner discussed above to pattern a second side 1026 of the disk 1019. It should be noted that the disk holder 1008 can be electrically grounded or electrically biased to improve ion milling parameters.

Figure 11:
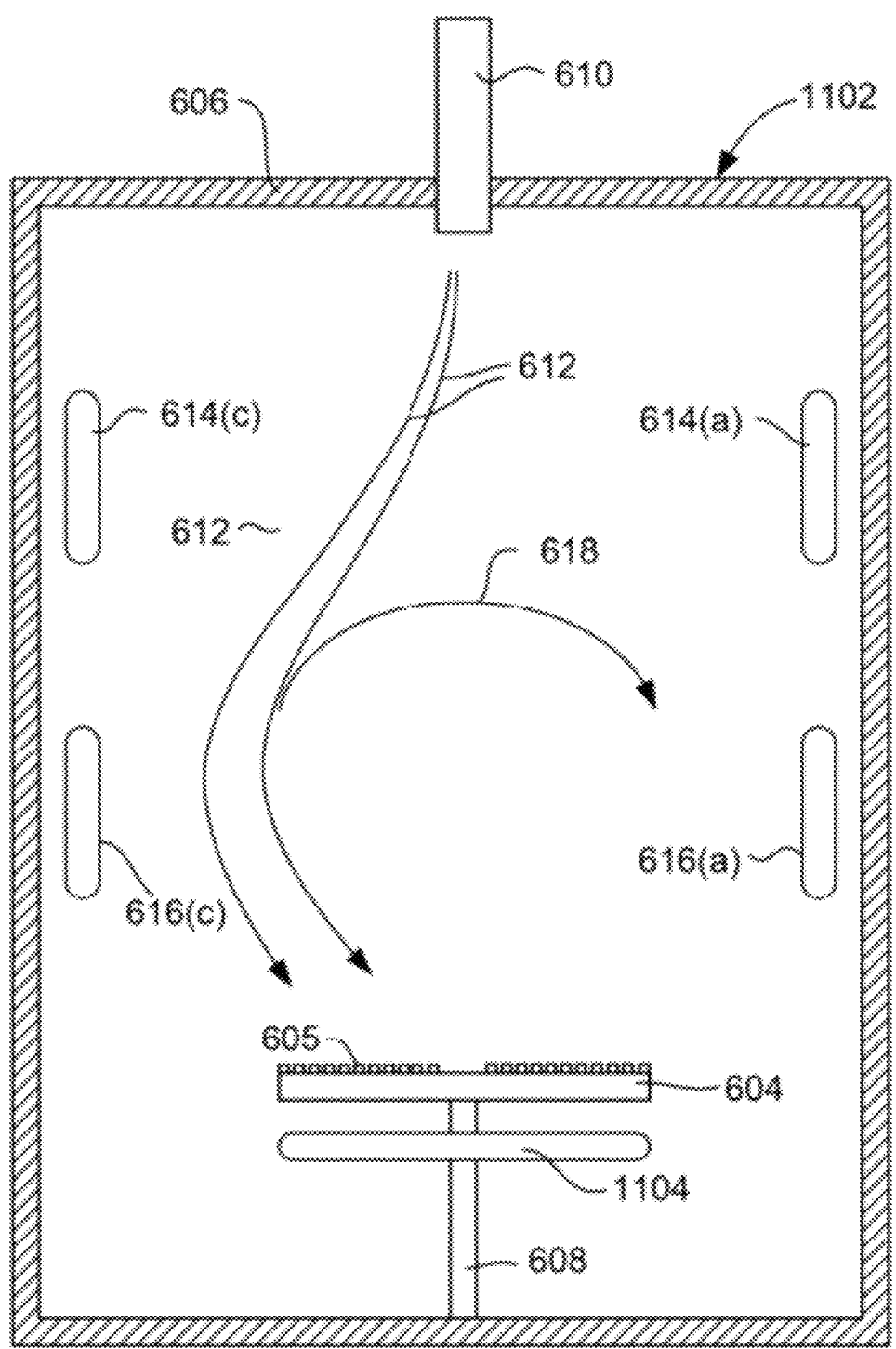
FIG. 11 is a cross sectional view of a tool for patterning magnetic media according to yet another embodiment of the invention.

FIG. 11 illustrates yet another possible embodiment of the invention. This embodiment includes a tool 1102 that is similar to the tool 602 described above with reference to FIG. 6, except that this tool 1102 includes an additional magnet 1104. The additional magnet 1104 can be located directly beneath the disk 604, and when activated, can be used to focus or defocus the ion beam 612. This allows the ion beam to strike a larger area of the disk 604, thereby altering the speed and uniformity of the patterning of the disk 604.

Figure 12A:
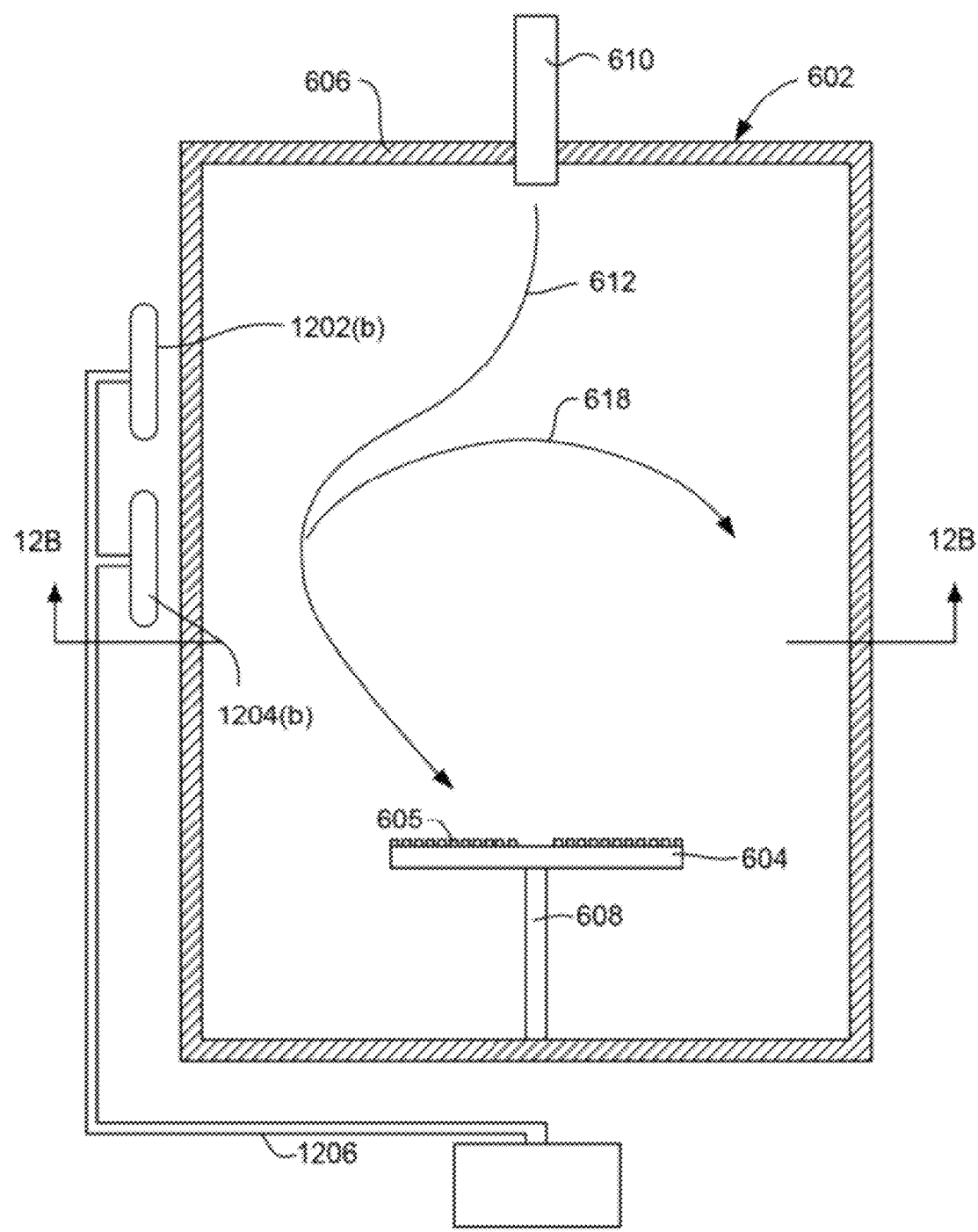
FIG. 12A is a cross section view of a tool for patterning magnetic media according to still another embodiment of the invention.
Figure 12B:
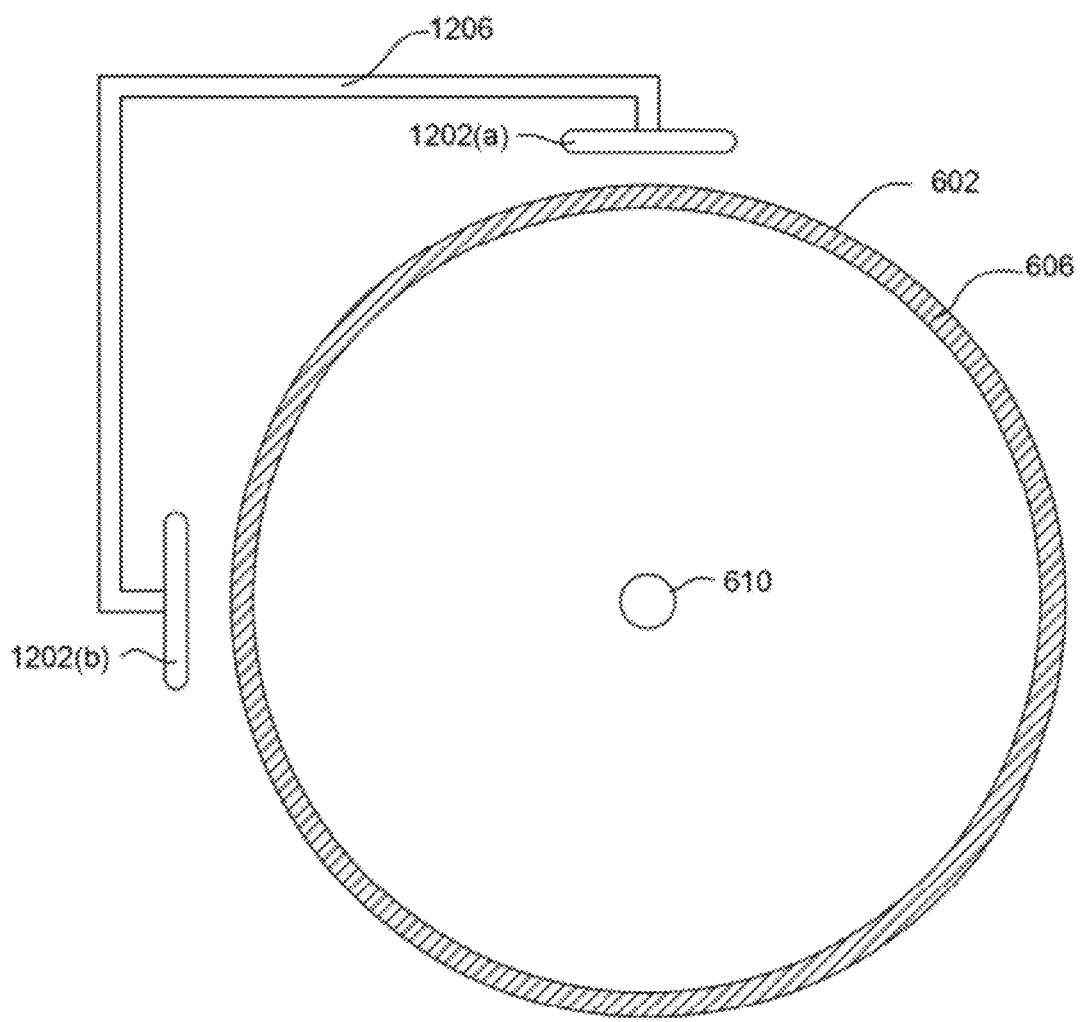
FIG. 12B is a cross sectional view taken from line 12B-12B of FIG. 12A.

With reference now to FIGS. 12A and 12B, yet another embodiment of the invention is possible. This embodiment includes a first set 1202 of magnets nearer to the ion beam source and a second set of magnets 1204 further from the ion beam source 610. In this embodiment, the magnets 1202, 1204 can be mounted on structure 1206 that allows the magnets themselves to revolve about the chamber 606. This would produce a magnetic field that is perpendicular to the path of the ion beam 612. If the chamber is a non-magnetic metal such as aluminum, then the magnets 1202, 1204 can be mounted outside of the chamber 606. This embodiment allows for simplified electronics, because the magnets 1202, 1204 themselves revolve around the chamber 606 rather than requiring circuitry to activate various magnets at various times about the chamber. In addition, in this embodiment, the magnets 1202, 1204 can be hard, permanent magnets rather than electro-magnets, although electromagnets could be used as well. Also, with this embodiment, each set of magnets 1202, 1204 could include only two sets of magnets located outside of the chamber 606. As with the previously described embodiments, the second set of magnets would preferably produce a stronger magnetic field than the first set of magnets, in order to produce the desired angled ion milling.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A tool for treating a substrate, comprising:
a chamber having an end and a chamber wall;
a mechanism for holding a sample within the chamber;
an ion source located at the end of the chamber;
a first series of magnets spaced about the chamber wall at a first location;
a second series of magnets spaced about the chamber wall at a second location, the first location being closer to the ion source than the second location; and
circuitry connected with the first and second magnets to control the activation of first and second series of magnets so that the first series of magnets deflects the ion beam outward toward the chamber wall, and the second series of magnets deflects the ion beam inward away from the chamber wall thereby curving the ion beam path that terminates at the sample, the circuitry also being configured to control activation of the magnets within each of the first and second series of magnets to cause the curved ion beam to rotate about an axis that is perpendicular to the sample, such that the ion beam impinges the sample with a rotating angle.

2. A tool as in claim 1 wherein the sample comprises a magnetic disk.

3. A tool as in claim 1 wherein the tool also contains a metrology device to in-situ measure the substrate.

4. A tool as in claim 1 wherein each magnet of the first series has an associated magnet of the second series and wherein the circuitry activates the magnets of the first and second series of magnets such that an activated magnet of the first series of magnets emits a magnetic field that has an opposite polarity with a magnetic field of its associated magnet in the second series of magnets.

5. A tool as in claim 1 wherein the mechanism for holding the sample within the chamber is clamp that clamps an inside diameter of the disk.

6. A tool as in claim 1 wherein the mechanism for holding the sample within the chamber is a clamp that clamps an outer periphery of the sample.

7. A tool as in claim 1 wherein each of the first and second series of magnets includes four magnets evenly spaced about the chamber.

8. A tool as in claim 1 wherein each of the series of magnets are evenly spaced about the chamber.

9. A tool as in claim 1 further comprising a magnet located adjacent to the sample such that sample is located between the magnet and the ion beam source.

10. A tool as in claim 1 wherein the circuitry connected with the first and second magnets to control the activation of first and second series of magnets further comprises circuitry for adjusting the strength of the magnetic field from the magnets so as to adjust an amount of deflection of the ion beam.

11. A tool as in claim 1 wherein the circuitry connected with the first and second magnets to control the activation of first and second series of magnets causes the ion beam to revolve about the axis of the chamber with an adjustable angular frequency.

12. A tool as in claim 1 wherein the substrate is a magnetic medium having a magnetic layer and a masking layer formed thereon, and wherein the tool patterns the magnetic layer.

13. A tool for patterning a substrate, the tool comprising:
a chamber having first and second ends;
a mechanism for holding a disk within the chamber, such that a first surface of the disk is exposed toward the first end of the chamber and a second surface of the disk is exposed toward the second end of the chamber;
a first series of magnets spaced about the chamber and located between the disk and the first end of the chamber;
a second series of magnets spaced about the chamber and located between the disk and the first series of magnets;
a third series of magnets spaced about the chamber and located between the disk and the second end of the chamber;
a fourth series of magnets spaced about the chamber and located between the disk and the third series of magnets;
a first ion beam source located at the first end of the chamber; and
a second ion beam source located at the second end of the chamber;
wherein the first and second series of magnets are located between the first ion source and the disk, and the third and fourth series of magnets are located between the second ion source and the disk, and ions from the ion sources impinge upon the substrate.

14. A tool as in claim 13 further comprising circuitry connected with the first and second series of magnets and functional to activate the magnets so as to bend and revolve an ion beam emitted from each of the first ion beam source; and
circuitry connected with the third and fourth series of magnets and operable to bend and revolve an ion beam from the second ion beam source.

15. A tool as in claim 14 wherein the circuitry is operable to vary the strength of at least some of the magnets of the first, second, third and fourth series of magnets to alter the amount of deflection of the ion beams from the first and second ion beam sources.

16. A tool as in claim 13 wherein the mechanism for holding the disk comprises a clamp configured to hold an outer periphery of the disk.

17. A tool as in claim 13 wherein the clamp is electrically connected to ground or with an electrical bias.

18. A tool as in claim 13 wherein the disk is held in the center of the chamber and wherein the first and second series of magnets are located in a fust half of the chamber and the third and fourth series of magnets are located in a second half of the chamber.

19. A tool as in claim 13, wherein the disk comprises a magnetic media, and wherein ions from the ion beam pattern a magnetic media, and wherein said media has a predefined mask formed thereon to define a magnetic media pattern.

20. A tool for patterning a substrate, comprising:
a chamber having an end and a chamber wall;
a mechanism for holding a magnetic disk within the chamber;
an ion source located at the end of the chamber;
a first set of magnets spaced about the chamber wall at a first location;
a second set of magnets spaced about the chamber wall at a second location, the first location being closer to the ion source than the second location; and
a structure connected with first and second sets of magnets, the structure being operable to cause the magnets to revolve about the chamber.

21. A tool as in claim 20 wherein the magnets of the first and second sets of magnets are located outside of the chamber.

22. A tool as in claim 20 wherein the magnets of the first and second sets of magnets are hard magnetic permanent magnets.

* * * * *

UNITED STATES PATENT AND TRADEMARK OFFICE
CERTIFICATE OF CORRECTION

PATENT NO. : 8,232,532 B2
APPLICATION NO. : 12/489873
DATED : July 31, 2012
INVENTOR(S) : Albrecht et al.

Page 1 of 1

It is certified that error appears in the above-identified patent and that said Letters Patent is hereby corrected as shown below:

In the claims:

Column 9, Claim 18, Line 5, please replace "in a fust half" with --in a first half--

Signed and Sealed this
Seventh Day of May, 2013

Teresa Stanek Rea
*Acting Director of the United States Patent and Trademark Office*